(12) United States Patent
Forster

(10) Patent No.: US 11,798,901 B1
(45) Date of Patent: Oct. 24, 2023

(54) WAFER-SCALE INTEGRATION WITH ALTERNATIVE TECHNOLOGY WAFER PROCESSES THAT CAN BE FOLDED INTO THREE-DIMENSIONAL PACKAGING

(71) Applicant: AVERY DENNISON RETAIL INFORMATION SERVICES, LLC, Mentor, OH (US)

(72) Inventor: Ian J. Forster, Chelmsford (GB)

(73) Assignee: Avery Dennison Retail Information Services LLC, Mentor, OH (US)

( * ) Notice: Subject to any disclaimer, the term of this patent is extended or adjusted under 35 U.S.C. 154(b) by 0 days.

(21) Appl. No.: 16/669,735

(22) Filed: Oct. 31, 2019

Related U.S. Application Data

(60) Provisional application No. 62/753,331, filed on Oct. 31, 2018.

(51) Int. Cl.
*H01L 23/00* (2006.01)
*H01L 27/00* (2006.01)

(52) U.S. Cl.
CPC ................ *H01L 23/564* (2013.01); *H01L 27/00* (2013.01)

(58) Field of Classification Search
CPC .............. H01L 23/564; H01L 27/00
See application file for complete search history.

(56) References Cited

U.S. PATENT DOCUMENTS

| | | | |
|---|---|---|---|
| 4,658,264 | A | 4/1987 | Baker |
| 6,107,920 | A | 8/2000 | Eberhardt et al. |
| 6,206,292 | B1 | 3/2001 | Robertz et al. |
| 6,262,692 | B1 | 7/2001 | Babb |
| 7,301,460 | B2 | 11/2007 | Coste |
| 7,460,085 | B2* | 12/2008 | Ishii .................... G06F 3/1423 345/1.1 |
| 2006/0237544 | A1 | 10/2006 | Matsuura et al. |

(Continued)

FOREIGN PATENT DOCUMENTS

| | | |
|---|---|---|
| DE | 4428732 C1 | 1/1996 |
| DE | 10233927 A1 | 2/2004 |
| EP | 1291818 A1 | 3/2003 |
| EP | 1559653 A1 | 8/2005 |
| EP | 2902294 A2 | 8/2015 |

(Continued)

OTHER PUBLICATIONS

International Preliminary Report on Patentability dated Apr. 27, 2021 issued in corresponding IA No. PCT/US2019/059020 filed Oct. 31, 2019.

(Continued)

*Primary Examiner* — David Vu
*Assistant Examiner* — Brandon C Fox

(57) ABSTRACT

Semiconductor wafer devices are formed of a wafer or a portion of a wafer. The wafer or wafer portion includes a plurality of functional blocks, one of which comprises an energy source and another which takes some other form, such as digital logic, data storage, a communication module, a display, a display driver, or a sensor. A functional block may be formed as part of processing of the wafer or may comprise a post-processing element. The functional blocks combine to provide an operational system having a plurality of functions. The wafer may be formed of an amorphous material, allowing the device to have a three-dimensional, non-planar structure, such as a cuboidal or tubular structure. If the device comprises only a portion of a wafer, a plurality of devices may be formed from a single wafer, with each portion being removed from the remainder of the wafer to define a device.

19 Claims, 4 Drawing Sheets

(56) References Cited

U.S. PATENT DOCUMENTS

| | | | |
|---|---|---|---|
| 2007/0029385 A1 | 2/2007 | Kovac et al. | |
| 2007/0182559 A1* | 8/2007 | Lawrence et al. | G08B 13/2445 340/572.7 |
| 2008/0292856 A1* | 11/2008 | Garner et al. | H01L 51/0097 428/220 |
| 2012/0032286 A1* | 2/2012 | Trusov et al. | G01C 21/16 257/417 |
| 2017/0294698 A1* | 10/2017 | Cho et al. | C23C 28/345 |
| 2017/0371452 A1* | 12/2017 | Endo et al. | G06F 3/0446 |
| 2018/0294230 A1 | 10/2018 | Dabral et al. | |

FOREIGN PATENT DOCUMENTS

| | | |
|---|---|---|
| WO | 2007/111417 A1 | 10/2007 |
| WO | 2010/081137 A2 | 7/2010 |
| WO | 2015/094259 A1 | 6/2015 |
| WO | 2018/096454 A1 | 5/2018 |
| WO | 2019/123152 A1 | 6/2019 |

OTHER PUBLICATIONS

International Search Report and Written Opinion dated Mar. 12, 2020 issued in corresponding IA No. PCT/US2019/059020 filed Oct. 31, 2019.

* cited by examiner

US 11,798,901 B1

WAFER-SCALE INTEGRATION WITH ALTERNATIVE TECHNOLOGY WAFER PROCESSES THAT CAN BE FOLDED INTO THREE-DIMENSIONAL PACKAGING

BACKGROUND

Cross Reference to Related Application(s)

The present application claims priority to and the benefit of U.S. Provisional Utility Pat. Application No. 62/753,331 filed Oct. 31, 2018, which is incorporated herein by reference in its entirety.

FIELD OF THE DISCLOSURE

The present subject matter relates to semiconductor wafer devices. More particularly, the present subject matter relates to single devices formed at a wafer level, which may be capable of being folded or otherwise formed into a three-dimensional, non-planar configuration.

DESCRIPTION OF RELATED ART

Traditional semiconductor processes employ crystalline semiconductors, such as silicon, gallium, arsenide, germanium, etc. Such materials are processed into wafers 10, as in FIG. 1, which are sheets that are substantially planar and frequently circular or substantially circular in shape. As in FIG. 1, a plurality of individual functional units or components or chips 12 are formed on the wafer 10, followed by the wafer 10 being cut or otherwise processed along lines 14 to separate the individual chips 12 from each other.

Each chip 12 is a proportion of the cost of the wafer 10, which is determined primarily by area. For example, if the wafer 10 costs $2,000 to manufacture and includes two hundred chips 12, each chip 12 costs $10. These traditional materials and processes are expensive, considering the fact that a single chip 12 requires additional supporting structures (e.g., a printed circuit board).

SUMMARY

There are several aspects of the present subject matter which may be embodied separately or together in the devices and systems described and claimed below. These aspects may be employed alone or in combination with other aspects of the subject matter described herein, and the description of these aspects together is not intended to preclude the use of these aspects separately or the claiming of such aspects separately or in different combinations as may be set forth in the claims appended hereto.

In one aspect, a semiconductor wafer device comprises a wafer or a portion of a wafer, with a plurality of functional blocks on said wafer or portion of a wafer. One of the functional blocks comprises an energy source, while another one of the functional blocks is not an energy source. The plurality of functional blocks combine to provide an operational system having a plurality of functions. The wafer or portion of a wafer is formed of an amorphous material.

In another aspect, a semiconductor wafer device comprises a wafer or a portion of a wafer, with a plurality of functional blocks on said wafer or portion of a wafer. One of the functional blocks comprises an energy source, while another one of the functional blocks is not an energy source. The plurality of functional blocks combine to provide an operational system having a plurality of functions. The wafer or portion of a wafer is formed of an amorphous material, and the wafer or portion of a wafer includes at least one fold line at which said wafer or portion of a wafer is configured to be folded.

In a further aspect, a semiconductor wafer device comprises a wafer or a portion of a wafer, with a plurality of functional blocks on said wafer or portion of a wafer. One of the functional blocks comprises an energy source, while another one of the functional blocks is not an energy source. The plurality of functional blocks combine to provide an operational system having a plurality of functions. The wafer or wafer portion defines a three-dimensional, non-planar structure.

In an added aspect, a semiconductor wafer device comprises a wafer or a portion of a wafer, with a plurality of functional blocks on said wafer or portion of a wafer. One of the functional blocks comprises an energy source, while another one of the functional blocks is not an energy source. The plurality of functional blocks combine to provide an operational system having a plurality of functions. The wafer or wafer portion defines a three-dimensional, non-planar structure, and the wafer or portion of a wafer includes at least one fold line at which said wafer or portion of a wafer is configured to be folded.

In yet another aspect, a method is provided for manufacturing a semiconductor wafer device. The method includes providing a wafer formed of an amorphous material and applying a plurality of functional blocks to a portion of the wafer. One of the functional blocks comprises an energy source, while another one of the functional blocks is not an energy source. The plurality of functional blocks combine to provide an operational system having a plurality of functions.

According to another aspect, a method is provided for manufacturing a plurality of semiconductor wafer devices. The method includes providing a wafer formed of an amorphous material and applying a plurality of functional blocks to first and second portions of the wafer. One of the functional blocks comprises an energy source, while another one of the functional blocks is not an energy source. The plurality of functional blocks combine to provide an operational system having a plurality of functions. This aspect further includes forming the portions of the wafer into three-dimensional, non-planar structures after removing the first portion and the second portion of the wafer from the remainder of the wafer.

DESCRIPTION OF THE ILLUSTRATED EMBODIMENTS

As required, detailed embodiments of the present invention are disclosed herein; however, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner.

Figure 1:
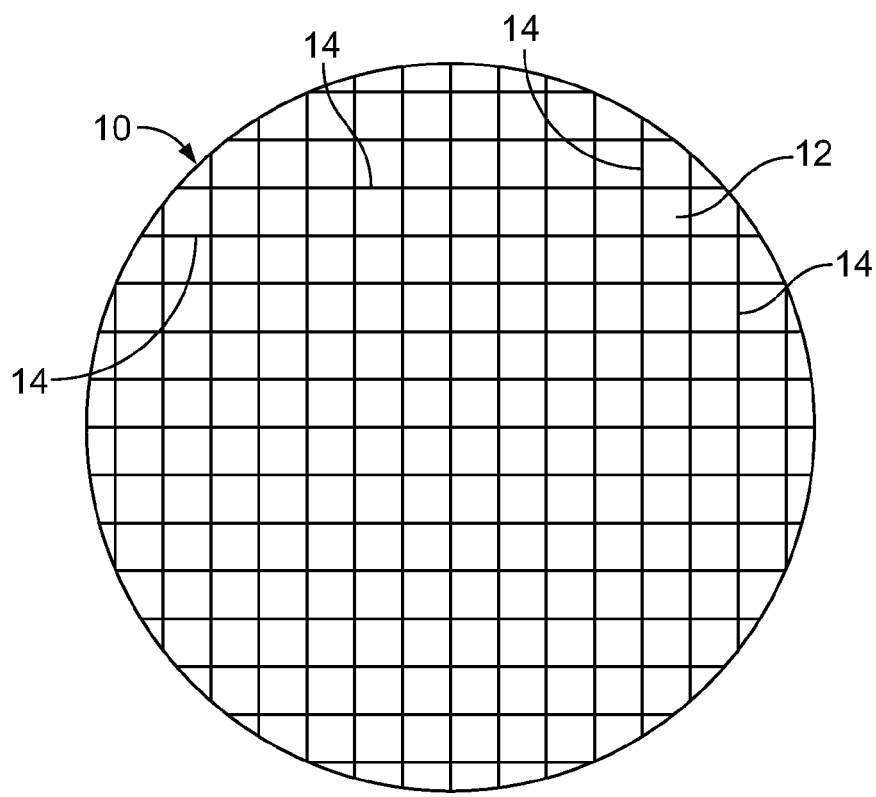
FIG. 1 is a top plan view of a semiconductor wafer device according to conventional design.
Figure 2:
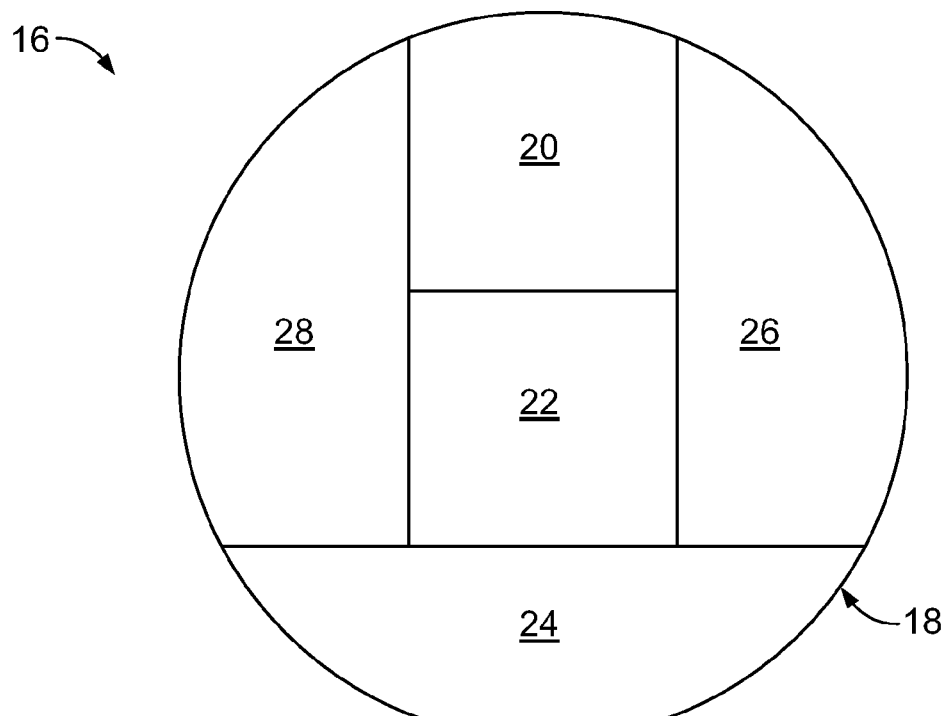
FIG. 2, FIG. 3, and FIG. 4 are each a top plan view of a different embodiment of a semiconductor wafer device according to aspects of the present disclosure.

FIG. 2 shows an exemplary semiconductor wafer device 16 according to an aspect of the present disclosure. The semiconductor wafer device 16 is a single device formed at wafer level, although it is also within the scope of the present disclosure for a semiconductor wafer device to comprise only a portion of a wafer, as will be described in greater detail herein.

Figure 5:
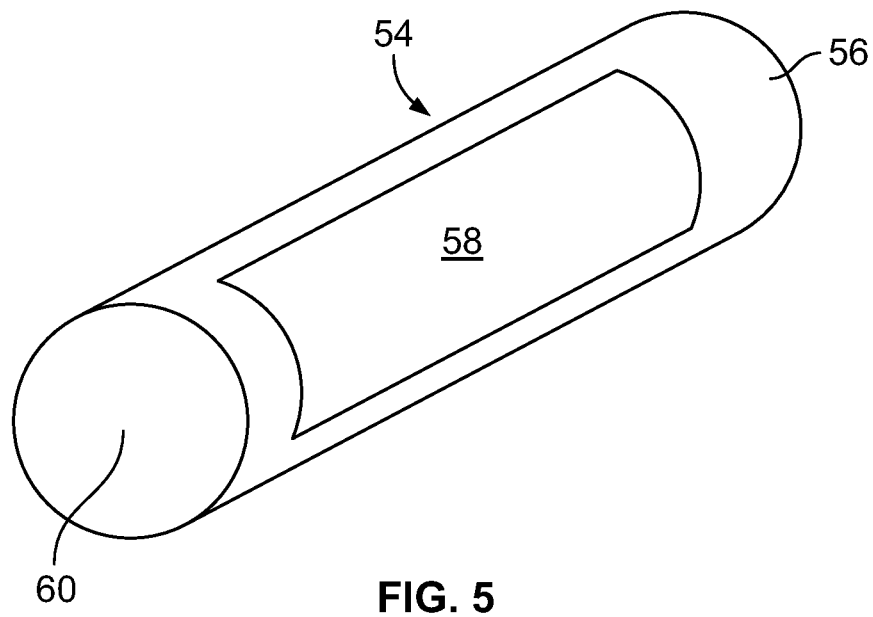
FIG. 5 is a top perspective view of a semiconductor wafer device according to an aspect of the present disclosure, formed into a three-dimensional, non-planar configuration.
Figure 7:
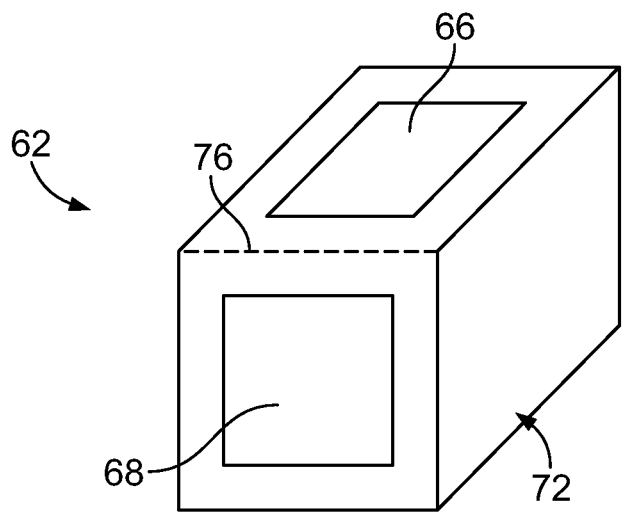
FIG. 7 is a top perspective view of the semiconductor wafer device of FIG. 6, formed into a three-dimensional, non-planar configuration.

The semiconductor wafer device 16 comprises a wafer 18, which is substantially planar and shown as having a circular perimeter, although wafers according to the present disclosure may have differently shaped perimeters. The wafer 18 may be formed of a conventional, crystalline semiconductor material (e.g., silicon, gallium, arsenide, germanium, etc.), but is more preferably formed of an alternative, lower cost semiconductor material. In particular, it may be advantageous for the wafer 18 to be formed of a relatively low cost, amorphous material that may be folded or otherwise formed from an initial, substantially planar configuration to a three-dimensional, non-planar configuration. FIG. 5 and FIG. 7 illustrate different possible three-dimensional, non-planar configurations into which the wafers of semiconductor wafer devices of the present disclosure may be formed and will be described in greater detail herein. Suitable amorphous materials include, but are not limited to, amorphous silicon, metal oxides, and organic materials, such as polyaniline.

A plurality of functional blocks are present on the wafer 18. As can be seen in FIG. 2, the various functional blocks may be differently sized and/or shaped. The various functional blocks combine to provide an operational system (at a wafer level in the embodiment of FIG. 2, but at a smaller level in other embodiments) having a plurality of functions. Each semiconductor wafer device 16 according to the present disclosure includes an energy source 20 to provide power to the other functional blocks, along with at least one other functional block that is not an energy source, but is rather configured to perform some other function. For example, in the embodiment of FIG. 2, the semiconductor wafer device 16 includes a functional block configured as analog or digital logic 22 (e.g., a microcontroller core), data storage 24 (either volatile or non-volatile or a combination of both), and a communication module 26 (e.g., a radio frequency module capable of sending and/or receiving RF signals). The illustrated semiconductor wafer device 16 further includes a second energy source 28, which may be differently configured from the first energy source 20 (e.g., with one configured as a photovoltaic area or element and the other configured as a power-harvesting RF module).

A functional block may be formed during processing of the wafer 18 or may comprise a post-processing component that is associated to the wafer 18 after processing of the wafer 18 if the function/structure of the functional block is not compatible with the wafer processing. Examples of post-processing components include, but are not limited to, a printed antenna, an antenna made of a foil material, a photovoltaic element, a battery, a display film (such as an electrophoretic material), and combinations including one or more of these types of components.

Figure 3:
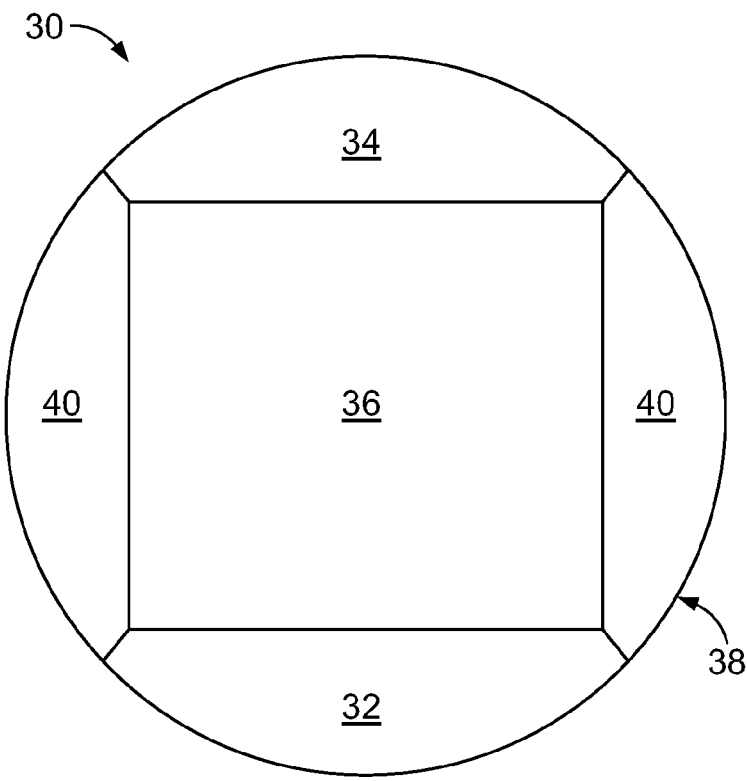

The functional blocks illustrated are merely exemplary, and components providing other functions may be incorporated into a semiconductor wafer device, depending on the desired functionality of the semiconductor wafer device. For example, FIG. 3 illustrates a semiconductor wafer device 30 having an energy source 32 and communication module 34 (as in the embodiment of FIG. 2), but further including a display 36 (which may occupy the majority of the surface of the wafer 38 to provide a large area display) and a pair of display drivers 40. The display 36 may be formed as part of the wafer processing or later associated to the wafer 38. Various components and/or portions of components may be positioned below the display 36 (i.e., between the display 36 and the underlying wafer 38), in addition to the assorted functional blocks arranged around the display 36. It should be understood that such an orientation of functional components (i.e., at least a portion of one functional component being positioned between the wafer and some other functional component) is not limited to displays, but may be employed with other types of functional blocks.

Figure 4:
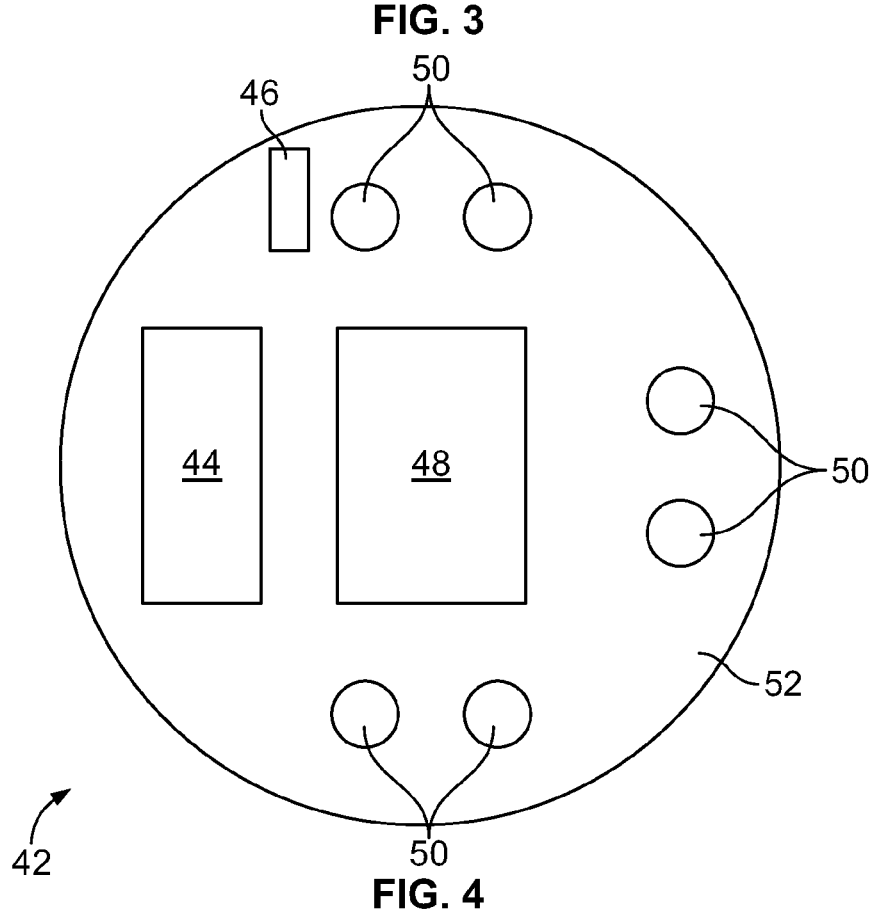

The semiconductor wafer device 42 of FIG. 4 includes an energy source 44 (which may be variously configured as a solar cell, a power-harvesting RF module, a chemical battery, a supercapacitor, or a piezoelectric element, for example), a communication module 46 (configured to communicate via near-field communication, WiFi, Bluetooth low energy, or RFID protocol, for example), and analog or digital logic 48. Additional functional blocks include a plurality of sensor spots 50 (which may be configured as metal oxide semiconductor transistors in one embodiment), which may be either additive material or formed during processing of the wafer 52. The sensor spots 50 may have discrete functions, such as detecting specific gases, temperature, liquids, combinations thereof, etc. or may be part of an assembly comprising an array of sensors which separately have relatively poor discrimination of a material, but whose readings are combined to achieve an enhanced result. Such an arrangement of sensors is commonly referred to as an "electronic nose" and is particularly well-suited for large area devices of the type described herein due to space being available for a large number of sensor spots 50.

FIG. 5 shows a semiconductor wafer device 54 according to an embodiment of the present disclosure in a three-dimensional, non-planar configuration. This reconfiguration of the semiconductor wafer device 54 is made possible by forming the wafer 56 from an amorphous material, as described above. In the embodiment of FIG. 5, the semiconductor wafer device 54 has been moved from its initial, substantially planar configuration to a generally tubular or cylindrical configuration. One of the functional blocks of the semiconductor wafer device 54 may be a display 58 (with other functional blocks comprising an energy source, display drivers, etc.), such that the semiconductor wafer device 54 may be wrapped or otherwise formed around a product 60 (or a portion of a product) to define packaging or an advertising display for the product 60 or be incorporated into a home automation system. In one embodiment, the semiconductor wafer device 54 itself may act as packaging for the product 60, whereas in other embodiments, the semiconductor wafer device 54 may be associated to some other material or substrate (e.g., a card) to form a portion of the packaging.

It should be understood that the three-dimensional, non-planar configuration of FIG. 5 is merely exemplary and that other configurations may be employed without departing from the scope of the present disclosure. Indeed, if a semiconductor wafer device must be folded or otherwise formed to fit into a defined space, the use of a wafer formed of an amorphous material makes it possible. By way of further example, FIG. 6 and FIG. 7 illustrate another particular three-dimensional, non-planar configuration that may be assumed by a semiconductor wafer device according to the present disclosure.

Figure 6:
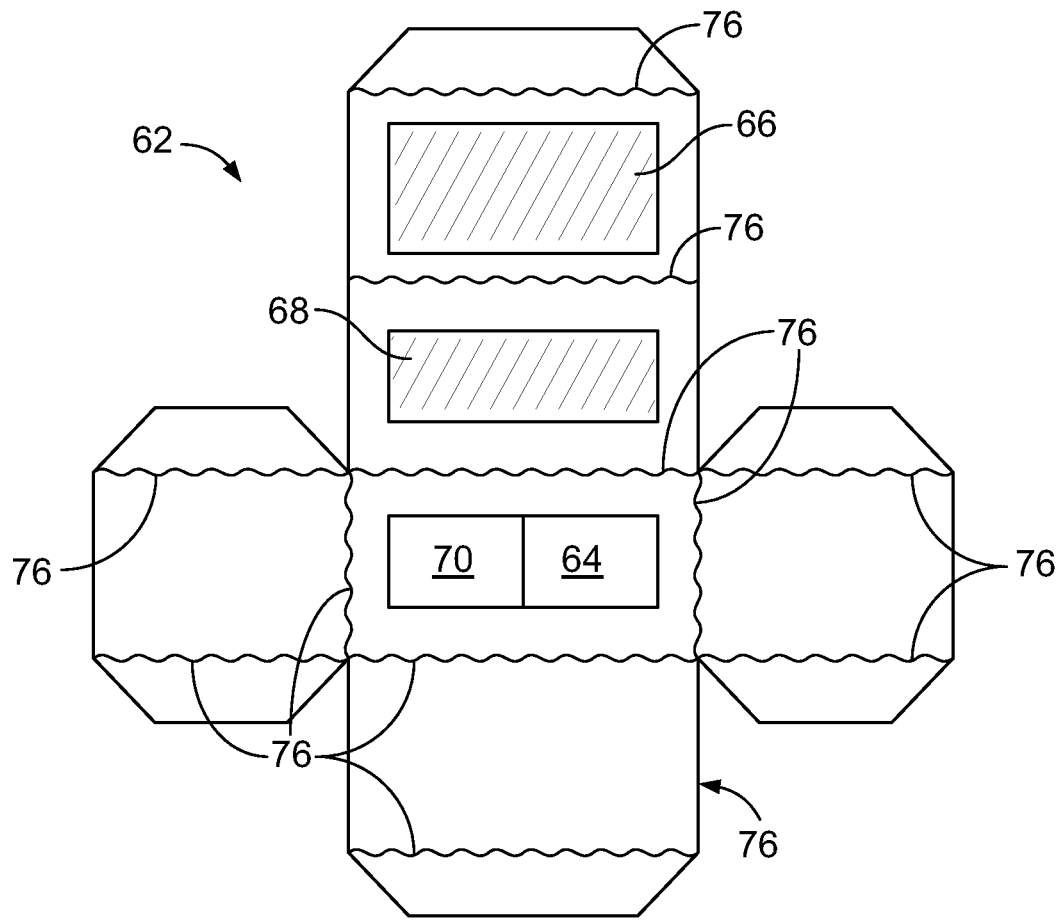
FIG. 6 is a top plan perspective view of a semiconductor wafer device according to an aspect of the present disclosure, in a substantially planar configuration.
Figure 8:
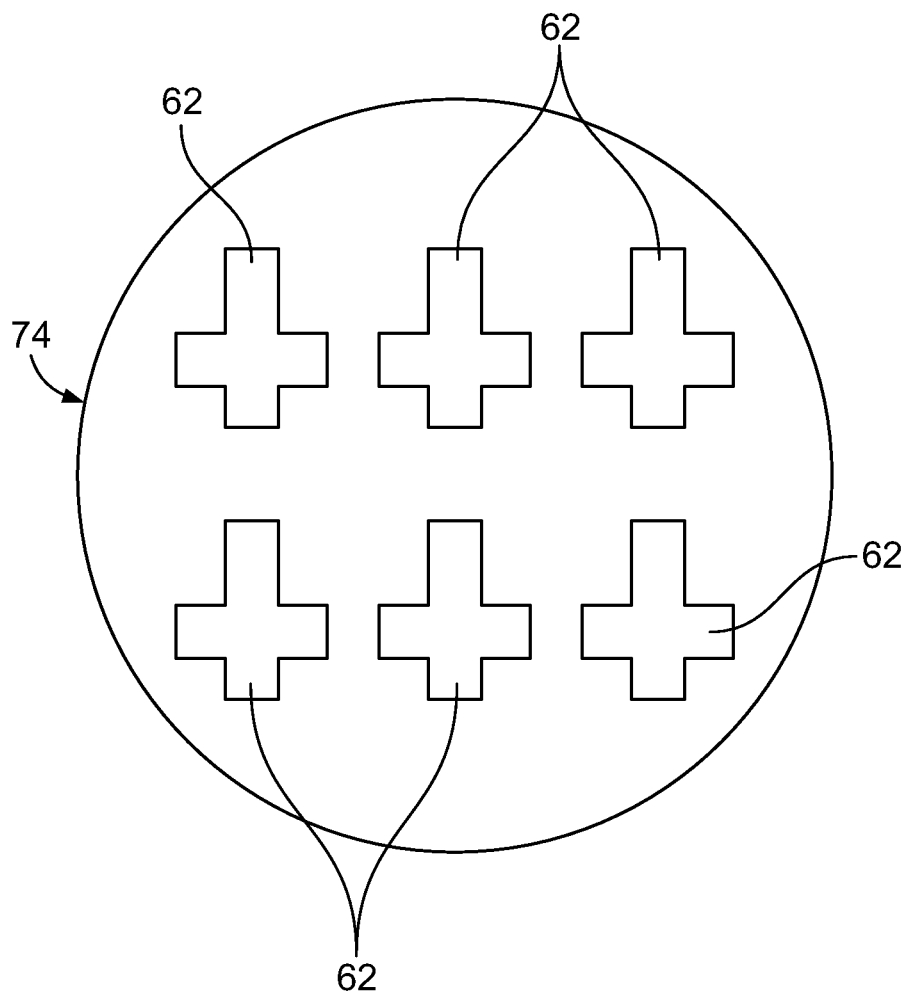
FIG. 8 is a top plan view of a wafer from which a plurality of semiconductor wafer devices of the type shown in FIG. 6 may be manufactured.

In the embodiment of FIG. 6 and FIG. 7, only a portion of a wafer is employed in defining a semiconductor wafer device 62. One or more of the various functional blocks (which may include an energy source 64, a display 66, an audio output 68, and display drivers and other functional electronics 70, for example) are associated to a portion 72 of a wafer, followed by the portion being removed from the remainder of the wafer. Additional functional blocks may be associated to the wafer portion after it has been removed from the remainder of the wafer. In one embodiment, a plurality of similarly configured semiconductor wafer devices 62 are formed using a single wafer 74 (FIG. 8), with each semiconductor wafer device 62 comprising a different portion of the wafer 74.

The wafer portion 72 of the semiconductor wafer device 62 includes a plurality of fold lines 76 at which the wafer portion 72 may be folded to move it from its substantially planar configuration of FIG. 6 to its three-dimensional, generally cuboidal of FIG. 7. The fold lines 76 may be undistinguished or featureless sections of the wafer portion 72 or may be provided with distinguishing characteristics, including fold line markings and/or features to improve their foldability. For example, the fold lines 76 may be scored or configured or made to be thinner than other sections of the wafer portion 72 in order to ease and guide folding of the wafer portion 72 during reconfiguration of the semiconductor wafer device 62.

The reconfigured semiconductor wafer device 62 may form a box or other package for an associated product. Providing such a semiconductor wafer device 62 with functional blocks comprising displays 66 and/or audio outputs 68 helps to make the product more attractive to a consumer.

It will be understood that the embodiments described above are illustrative of some of the applications of the principles of the present subject matter. Numerous modifications may be made by those skilled in the art without departing from the spirit and scope of the claimed subject matter, including those combinations of features that are individually disclosed or claimed herein. For these reasons, the scope hereof is not limited to the above description but is as set forth in the following claims, and it is understood that claims may be directed to the features hereof, including as combinations of features that are individually disclosed or claimed herein.

The invention claimed is:

1. A semiconductor wafer device, comprising:
a wafer or a portion of a wafer; and
a plurality of functional blocks on said wafer or portion of said wafer, wherein
one of the functional blocks comprises an energy source,
another one of the functional blocks is not an energy source,
the plurality of functional blocks combines to provide an operational system having a plurality of functions, wherein at least one of the plurality of functional blocks comprises a first component partially positioned between a second component and said wafer or portion of said wafer, and
said wafer or portion of a wafer is formed of an amorphous material.

2. The semiconductor wafer device of claim 1, wherein said wafer or portion of a wafer includes at least one fold line at which said wafer or portion of a wafer is configured to be folded.

3. The semiconductor wafer device of claim 1, wherein said one of the functional blocks comprises digital logic, data storage, a communication module, a display, a display driver, an audio output, or a sensor.

4. The semiconductor wafer device of claim 1, wherein at least one of the functional blocks comprises a post-processing element associated to said wafer or portion of a wafer after processing of said wafer or portion of a wafer.

5. The semiconductor wafer device of claim 1, wherein said wafer or portion of a wafer defines a three-dimensional, non-planar structure.

6. The semiconductor wafer device of claim 1, wherein said wafer or portion of a wafer defines a generally tubular structure.

7. The semiconductor wafer device of claim 1, wherein said wafer or portion of a wafer defines a generally cuboidal structure.

8. A semiconductor wafer device, comprising:
a wafer or a portion of a wafer; and
a plurality of functional blocks on said wafer or portion of a wafer, wherein
one of the functional blocks comprises an energy source,
another one of the functional blocks is not an energy source,
the plurality of functional blocks combine to provide an operational system having a plurality of functions, wherein at least one of the plurality of functional blocks comprises a first component partially positioned between a second component and said wafer or portion of said wafer, and
said wafer or portion of a wafer defines a three-dimensional, non-planar structure.

9. The semiconductor wafer device of claim 8, wherein said wafer or portion of a wafer defines a generally tubular structure.

10. The semiconductor wafer device of claim 8, wherein said wafer or portion of a wafer defines a generally cuboidal structure.

11. The semiconductor wafer device of claim 8, wherein said wafer or portion of a wafer is formed of a foldable material.

12. The semiconductor wafer device of claim 8, wherein said wafer or portion of a wafer is formed of an amorphous material.

13. A method of manufacturing a semiconductor wafer device, comprising:
providing a wafer formed of an amorphous material; and
applying a plurality of functional blocks to a portion of said wafer, wherein
one of the functional blocks comprises an energy source,
another one of the functional blocks is not an energy source, and
the plurality of functional blocks combine to provide an operational system having a plurality of functions, wherein at least one of the plurality of functional blocks comprises a first component partially positioned between a second component and said wafer or portion of said wafer.

14. The method of claim 13, further comprising removing said portion of the wafer from the remainder of the wafer.

15. The method of claim 13, further comprising
applying a plurality of functional blocks to a second portion of the wafer, wherein one of the functional blocks of the second portion of the wafer comprises an energy source, another one of the functional blocks of the second portion of the wafer is not an energy source, and the plurality of functional blocks of the second portion of the wafer combine to provide a second operational system having a plurality of functions, and removing said portion and said second portion of the wafer from the remainder of the wafer.

16. The method of claim 15, further comprising forming said portion and said second portion of the wafer into three-dimensional, non-planar structures after removing said portion and said portion of the wafer from the remainder of the wafer.

17. The method of claim 15, wherein said portion and said second portion of the wafer are substantially identical.

18. The method of claim 13, wherein said one of the functional blocks comprises digital logic, data storage, a communication module, a display, a display driver, an audio output, or a sensor.

19. The method of claim 13, wherein said applying a plurality of functional blocks to a second portion of the wafer includes associating at least one of said functional blocks to said portion of the wafer after processing said portion of the wafer.

* * * * *